United States Patent
Sun (10) Patent No.: US 10,474,527 B1
(45) Date of Patent: Nov. 12, 2019

(54) HOST-ASSISTED ERROR RECOVERY

(71) Applicant: Seagate Technology LLC, Cupertino, CA (US)

(72) Inventor: Yaohua Sun, Shoreview, MN (US)

(73) Assignee: Seagate Technology LLC, Cupertino, CA (US)

( * ) Notice: Subject to any disclaimer, the term of this patent is extended or adjusted under 35 U.S.C. 154(b) by 77 days.

(21) Appl. No.: 15/640,354

(22) Filed: Jun. 30, 2017

(51) Int. Cl.
*G06F 11/00* (2006.01)
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 6,526,477 B1 | 2/2003 | Yuan et al. | |
| 8,656,255 B1 * | 2/2014 | Nemazie | G06F 11/1008 365/133 |
| 8,856,431 B2 | 10/2014 | Chen et al. | |
| 9,135,112 B2 * | 9/2015 | Chen | G11C 16/00 |
| 9,183,140 B2 | 11/2015 | Werner et al. | |
| 9,189,332 B1 * | 11/2015 | Moon | G06F 11/1044 |
| 9,195,530 B1 * | 11/2015 | Jean | G06F 13/4027 |
| 2011/0066793 A1 * | 3/2011 | Burd | G06F 11/1028 711/103 |
| 2011/0078496 A1 * | 3/2011 | Jeddeloh | G06F 3/0616 714/6.24 |
| 2011/0191649 A1 * | 8/2011 | Lim | G06F 11/10 714/752 |
| 2011/0209028 A1 | 8/2011 | Post et al. | |
| 2012/0284587 A1 * | 11/2012 | Yu | G06F 3/0608 714/773 |
| 2013/0145085 A1 * | 6/2013 | Yu | G06F 12/0246 711/103 |
| 2014/0208004 A1 | 7/2014 | Cohen et al. | |
| 2014/0281142 A1 * | 9/2014 | Nemazie | G06F 12/0246 711/103 |
| 2014/0281802 A1 | 9/2014 | Coe | |
| 2015/0106410 A1 | 4/2015 | Zaltsman et al. | |
| 2017/0003981 A1 * | 1/2017 | Erez | G06F 9/4418 |
| 2017/0010815 A1 * | 1/2017 | Sprouse | G06F 3/0604 |
| 2017/0046221 A1 * | 2/2017 | Bandic | G06F 11/1044 |
| 2017/0269992 A1 * | 9/2017 | Bandic | G06F 11/1068 |
| 2018/0217928 A1 * | 8/2018 | Song | G06F 12/0269 |

* cited by examiner

*Primary Examiner* — Daniel F. McMahon
(74) *Attorney, Agent, or Firm* — Setter Roche LLP; Christian Best (57) ABSTRACT

Systems and methods are disclosed for host assisted error recovery at a data storage device. In an example embodiment, an apparatus comprises a data storage drive including an interface to communicate with a host device, a nonvolatile solid state memory, and a processor. The processor is configured to calculate parity data based on a plurality of pages from the nonvolatile solid state memory, and provide, in response to a request for the parity data received from the host device via the interface, the parity data to the host device with an indication to store the parity data to a nonvolatile storage medium.

20 Claims, 7 Drawing Sheets

HOST-ASSISTED ERROR RECOVERY

SUMMARY

In certain embodiments, an apparatus may comprise a data storage drive including an interface to communicate with a host device, a nonvolatile solid state memory, and a processor. The processor may be configured to calculate parity data based on a plurality of pages from the nonvolatile solid state memory, and provide, via the interface, the parity data to the host device with an indication to store the parity data to a nonvolatile storage medium.

In certain embodiments, a system may comprise a data storage drive and a host device. The data storage drive may include an interface to communicate with a host device, a nonvolatile solid state memory, and a controller configured to calculate parity data based on a plurality of pages from the nonvolatile solid state memory, and provide, via the interface, the parity data to the host device with an indication to store the parity data to a nonvolatile storage medium. The host device may include a processor configured to store the parity data to a persistent memory internal to the host device.

In certain embodiments, a method may comprise calculating parity data based on a plurality of pages from a nonvolatile solid state memory at a data storage drive, and providing the parity data from the data storage drive to a host device with an indication to store the parity data to a nonvolatile storage medium of the host device.

DETAILED DESCRIPTION

In the following detailed description of the embodiments, reference is made to the accompanying drawings which form a part hereof, and in which are shown by way of illustrations. The features of the various embodiments and examples described herein may be combined, exchanged, removed, other embodiments utilized, and structural changes made without departing from the scope of the present disclosure.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

In accordance with various embodiments, dedicated hardware implementations including, but not limited to, application specific integrated circuits, programmable logic arrays, and other hardware devices can be constructed to implement the methods and functions described herein. Further, the methods and functions described herein may be implemented as a device, such as a memory device, including instructions that when executed cause a processor to perform the methods.

Figure 1:
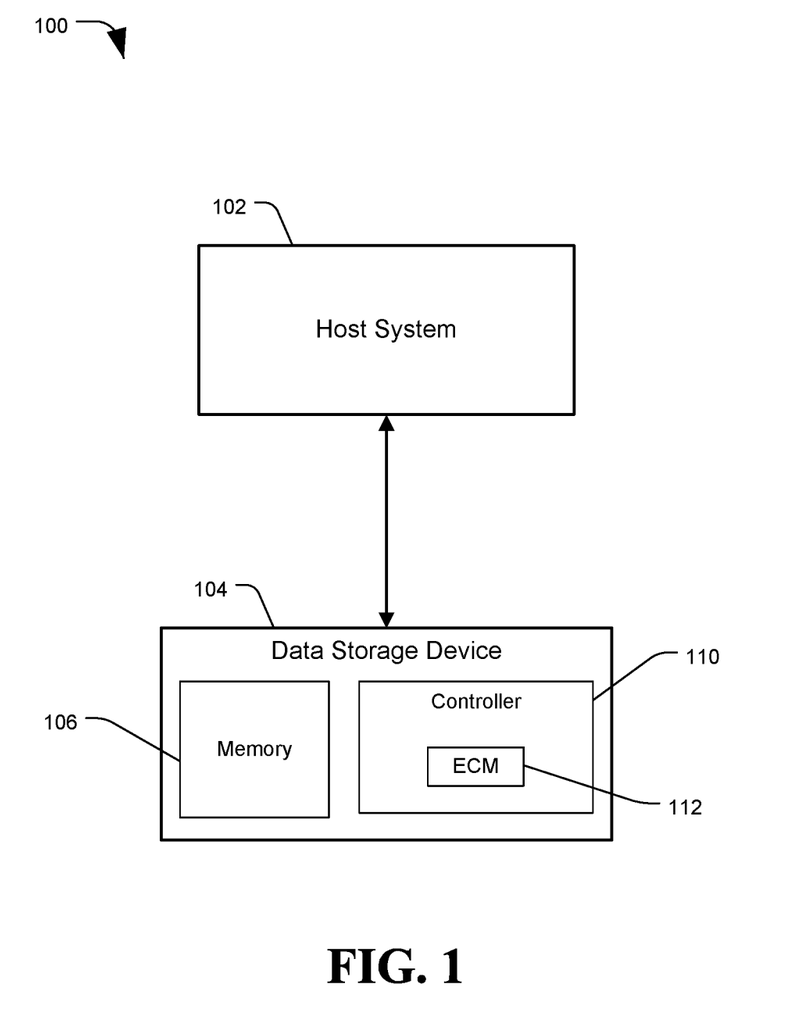
FIG. 1 is a diagram of a system configured to employ host-assisted error recovery, in accordance with certain embodiments of the present disclosure.

FIG. 1 is a diagram of a system, generally designated 100, configured to employ host-assisted error recovery, in accordance with certain embodiments of the present disclosure. The system 100 may include a data storage device (DSD) 104, such as a storage drive or any other device which may be used to store or retrieve data, including a solid state drive (SSD), or hybrid drive. As used herein, a data storage drive may refer to a device specifically adapted for data storage and retrieval to a memory internal to the drive, not including more general purpose processing devices such as computers and smart devices, although the DSD 104 and the teachings herein are not limited to such drives. In an example embodiment, a data storage drive may include an individual data storage drive that is not part of a distributed data storage system, e.g. RAID. The DSD 104 may include a memory 106 and a controller 110. The memory 106 may comprise one or more non-volatile memory (NVM) data storage mediums, such as solid state media like NAND flash memory, 3D XPoint®, other types of memory, or a combination thereof. The controller 110 may be one or more processors or circuits configured to perform data access operations, such as reads or writes, to the memory 106. Data retrieved from the memory 106, or to be stored to the memory 106, may be processed via the controller 110, a read/write (R/W) channel, or other elements for encoding or decoding data, error correction, or other processing.

The system 100 may include a host device 102, which may also be referred to as the host system or host computer. The host 102 can be one or more server-class computers, desktop computers, laptop computers, workstations, tablet computers, telephones, music players, the control system of a self-driving vehicle, other electronic devices, or any combination thereof. The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing). The host 102 may issue data access requests, such as read or write requests, to the DSD 104. In response, the DSD 104 may perform data access operations on the memory 106 via the controller 110 based on the requests.

A DSD 104, such as a NAND solid state drive or a hybrid drive, may encounter errors during data access operations. This may become more prevalent, and performance less reliable as devices reach the end of their lifecycle due to wear. Error correction operations may be performed to recover from some data access errors. Accordingly, the DSD 104 may also include an error correction module (ECM) 112, which may be included in the controller 110, or otherwise included in the DSD 106, such as in a R/W channel or as a stand-alone circuit. The ECM 112 may be configured to handle error correction operations when data is stored to or read from the memory 106. When data is stored to the memory 106, such as user data or host data, it may be stored with certain error recovery data or error correction code (ECC). ECC may include parity data and other information that can be used by the ECM 112 to mathematically reconstruct data that was not successfully read from the memory 106. For example, ECC may include XOR parity data or cyclic redundancy check (CRC) code. The ECM 112 may encode data to be written with ECC algorithms, and then decode read data and use the ECC to recover data that was lost due to errors.

For example, data on a memory 106 may include errors, either due to flaws in the physical storage medium, wear on solid state memory dies, or due to errors that occurred when the data was stored. Similarly, errors may occur during a read operation which prevent even error-free stored data from being read correctly. In an example solid state drive (SSD) device, the ECM 112 may perform operations on data to generate parity data which can be used to recover data when a read operation fails. The ECM 112 may generate ECC data from received write data for an individual page, such as low density parity check (LDPC) codes, Bose, Chaudhuri, and Hocquenghem (BCH) codes, or other ECC information. This ECC parity information may be stored to the page along with the user data (e.g. embedded within the user data itself, or stored to a spare region of the page), and may be a type of inner code (IC) ECC. If a number of bits of a page of data are not successfully read, the ECM 112 may be able to use the included parity data to recover the missing bits. When error correction using the parity data included within a page fails, it may be referred to as an uncorrectable ECC error (UECC error). However, the ECM 112 may also be able to generate parity data for an entire group of pages, which may be a type of outer code (OC) ECC. For example, the ECM 112 can generate XOR parity code for a selected set of pages by performing an XOR operation on those pages to generate a page of parity information. If a read to a page from the selected set of pages later fails, the ECM 112 may be able to recover the information using the XOR parity page and the other pages from the selected set of pages. The selected set of pages from which the parity page is generated may be referred to as a parity stripe. The ECM 112 may use the parity page to recover data even when a UECC error occurs.

Once a parity page has been generated from a parity stripe, it must be stored to nonvolatile memory for later access if needed. However, storage capacity of a DSD 104 may be limited and valuable, such as in the case of flash SSDs. Further, parity data may not be required often, especially early in a device's lifecycle. Storing parity pages for each page stripe to an SSD may consume a significant portion of the total capacity, while not actually being needed for the majority of the device's operating life. Such an arrangement may reduce capacity available for users, and increase costs of the DSD 104. Further, the host or users may not be aware of when the DSD 104 is reaching the end of its life-cycle and employing more parity stripe-based error correction, which may lead to data loss when the DSD eventually fails.

However, the ECM 112 may be configured to channel the parity pages to the host 102 for storage. The host 102 may have cheaper or excess spare storage capacity available to store the parity pages. When a UECC error is encountered (e.g. when requested data failed to read or decode using ECC embedded within the page(s)), the ECM 112 may obtain the parity page from the host 102 and use it to help recover from the read error. In some embodiments, drivers may be loaded to the host 102 to assist in storage and retrieval of parity data from the host 102. Storing parity data to the host 102, especially OC parity data within a parity stripe, can improve the performance and value of the DSD 104 by improving capacity, reducing wear on the internal memory 106, and providing other benefits. For example, if the DSD 104 needs to retrieve parity data from the 102, the host may become aware of error recovery operations it would not normally know about. This may allow the host or users to take precautions, such as backing up sensitive data or performing firmware upgrades, when read errors are reported. An example embodiment of system 100, including a more detailed diagram of DSD 104, is depicted in FIG. 2.

Figure 2:
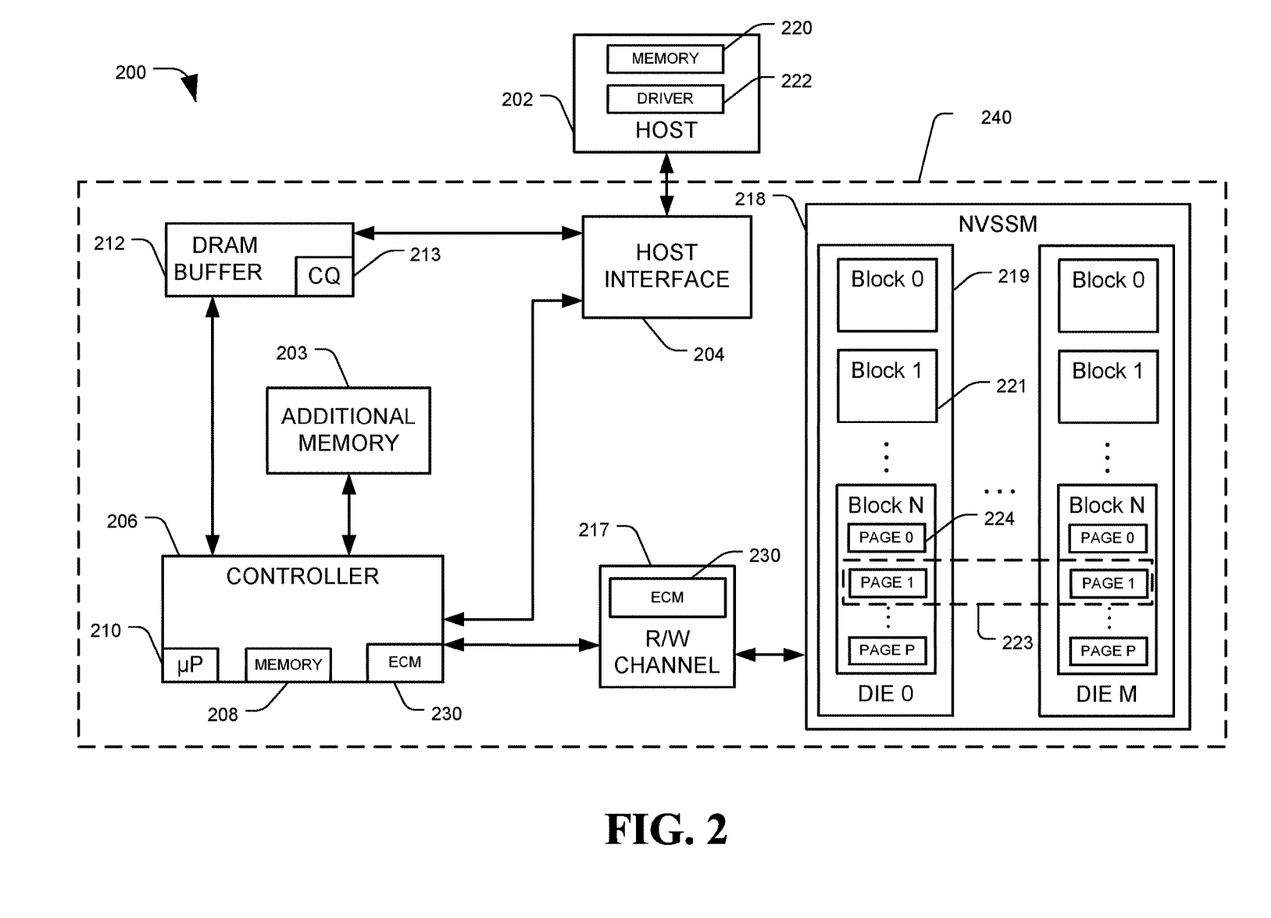
FIG. 2 is a diagram of a system configured to employ host-assisted error recovery, in accordance with certain embodiments of the present disclosure.

FIG. 2 is a diagram of a system, generally designated 200, configured to employ host-assisted error recovery, in accordance with certain embodiments of the present disclosure. Specifically, FIG. 2 provides a functional block diagram of an example data storage device (DSD) 200, which may be an example of the DSD 104 of FIG. 1. The DSD 200 may also be referred to as solid state drive (SSD) 200, according to some embodiments. The DSD 200 can communicate with a host device 202 (such as the host system 102 shown in FIG. 1) via a hardware or firmware-based interface circuit 204. The interface 204 may comprise any interface that allows communication between a host 202 and a DSD 200, either wired or wireless, such as USB, IEEE 1394, Compact Flash, SATA, eSATA, PATA, SCSI, SAS, PCIe, Fibre Channel, Ethernet, or Thunderbolt, among others. The interface 204 may include a connector that allows the DSD 200 to be physically removed from the host 202. The DSD 200 may have a casing 240 housing the components of the DSD 200. The DSD 200 may communicate with the host 202 through the interface 204 over wired or wireless communication.

The buffer 212 can temporarily store data during read and write operations, and can include a command queue (CQ) 213 where multiple pending operations can be temporarily stored pending execution. Commands arriving over the interface 204 may automatically be received in the CQ 213 or may be stored there by controller 206, interface 204, or another component.

The DSD 200 can include a programmable controller 206, which can include associated memory 208 and processor 210. The controller 206 may control data access operations, such as reads and writes, to one or more nonvolatile solid state memories (NVSSM) 218, such as NAND flash memory. The DSD 200 may include an additional memory 203 instead of or in addition to NVSSM 218. For example, additional memory 203 can be either volatile memory such as DRAM or SRAM, disc-based nonvolatile memories such as magnetic hard discs, other types of memory, or a combination thereof. The additional memory 203 can function as a working memory for storing generated parity data, a cache to store recently or frequently read or written data, or data likely to be read soon, or for other temporary data storage. Additional memory 203 may also function as main long-term storage instead of or in addition to NVSSM 218. A DSD 200 containing multiple types of nonvolatile storage mediums, such as a disc(s) and flash, may be referred to as a hybrid storage device.

The DSD 200 can include a read-write (R/W) channel 217, which can encode data during write operations and reconstruct user data retrieved from a memory, such as NVSSM 218, during read operations.

The NVSSM 218 may include NAND flash memory, according to some embodiments. A NAND flash memory device may include one or more physical die 219 for storing data. Each die 219 may include a plurality of blocks 221, which may be the smallest unit that can be erased in a NAND flash memory. A block 221 may store, e.g., 4-8 MB of data. Each block 221 may include a plurality of pages 224, which may be the smallest unit of storage that can be programmed, or written to. An example page may store 8 or 16 KB of data. Write data received from the host 202 may therefore be written the NVSSM 218 one page 224 at a time. An example NAND die 219 may comprise multiple (for example, approximately 1000) NAND blocks 221, and within each NAND block 221 there mere may be multiple NAND pages (for example, approximately 512).

Data stored to NAND flash may not be overwritten or edited, so as updated data comes in, older versions are left written to a previous page 224 and marked as invalid, while the updated data is written to a new page 224. When the storage space begins to fill up, the DSD 200 may perform garbage collection operations, which may include selecting an old block 221 having pages with invalid data, copying the valid data to pages 224 of a new block 221, and erasing the entire old block 221.

DSD 200 may include an error correction module (ECM) 230. The ECM 230 may be included in the controller 206, the R/W channel 217, in other components, as a stand-alone component, or any combination thereof. The ECM 230 may perform the methods and processes described herein to generate parity data for stored data, perform error correction using parity data during reads, and providing parity data to the host 202 for storage.

As discussed herein, each page 224 of the NVSSM 218 may be stored with host or user data, as well as some parity or redundancy data (e.g. some number of parity bits) which may be generated and used by the ECM 230 for error recovery when reading data from that page. However, some errors may not be able to be corrected using the parity data stored to a page, resulting in an UECC error. The ECM 230 may generate additional parity data for a group of pages, which group may referred to as a parity stripe 223. In an example embodiment, the ECM 230 may XOR the data from each page 224 in the parity stripe 223 to generate a parity page. In the depicted example, the SSD 200 may contain M (M is an integer, e.g. ranging from 8 to 128) NAND dies 219; within each die 219, there may be N blocks 221 (N is an integer, e.g. approximately 1000); within each block 221, there may be P pages 224 (P is an integer, e.g. approximately 512). A parity stripe 223 may comprise one page 224 at the same block/page offset from each of the die 219. For example, page 1 from block n from each die could be referred to as P-page (parity page) 1 in P-block (parity block) n. Similarly, a parity stripe 223 may include P-page 3 in P-block 8, so that it includes page 3 from block 8 of each die 219 of the NVSSM 218. Other arrangements of groups of pages may be used, or e.g. parity stripes may include pages at the same offset of every block of only half of the die of a NVSSM 218.

Storing the parity page a parity stripe 223 internally to the SSD 200 may require setting aside storage capacity for the parity pages for each parity stripe. For example, a die 219 may be designated for storage of parity pages. For each P-page, the SSD controller 206 could use internal hardware or software mechanisms to use one NAND page 224 out of M dies 219 to store the XOR result of all other NAND pages 214 within this P-page. Later on, if a NAND read operation on any of the NAND pages 214 within this P-page fails, the ECM 230 could make use of the XOR redundancy data and the other pages 214 of the P-page to perform error recovery for the failed page. Because a NAND SSD may have other ECC mechanisms within the NAND page, such as LDPC ECC code or BCH ECC code, the parity stripe-based recovery may be very rarely used until the end of SSD life. Further, when parity stripe-based recovery is performed, the drive performance may be slow, because the SSD may need to read out all the other pages within the P-page to perform the recovery.

Accordingly, it may provide improved performance and efficiencies to channel the parity data to the host 202. Driver software 222 could be installed at the host 202 and executed by controller circuits or processors, in order to facilitate the storage of parity pages to a persistent memory 220 of the host device that retains data after power is shut off, such as an internal HDD. The driver 222 may be provided by a manufacturer or vendor of the SSD 200, for example by loading the driver software 222 to a memory of the SSD 200, which may be installed to the host 202 when the SSD 200 is connected. Existing host drivers may also be modified or adapted to perform the functions described herein.

The ECM 230 may therefore generate parity data (e.g. a parity page) based on a parity stripe 223. The parity data may be generated or updated when the data stored to a parity stripe changes, for example due to received write commands or garbage collection operations. The ECM 230 may then provide the parity data to the host 202 via the host interface 204. For example, in an embodiment where the SSD 200 can only send information to the host 202 in response to host commands or instructions, the drivers 222 may initiate a request for parity data and send it from the host 202 to the SSD 200. In response, the ECM 230 may return any parity data that has changed or is new since the last time parity data was provided to the host 202. The ECM 230 may include one or more identifiers or indicators with each parity page, which the ECM 230 can later use to request specific parity information in order to perform error recovery. The drivers 222 may receive the parity data and, based on the indicators, store the parity data to a location in the host memory 220. For example, the drivers 222 may apply an algorithm or equation to derive a physical or logical block address (PBA or LBA) at which to store the parity data, so that when a request for parity data with the same indicator is received later, the drivers 222 can perform the equation again to locate the data, without the need to maintain an address or mapping system. The host 202 may have a reserved or spare storage location of the memory 220 in which parity data may be stored. Example implementations of host-assisted error recovery are discussed in regard to FIGS. 3-7.

Figure 3:
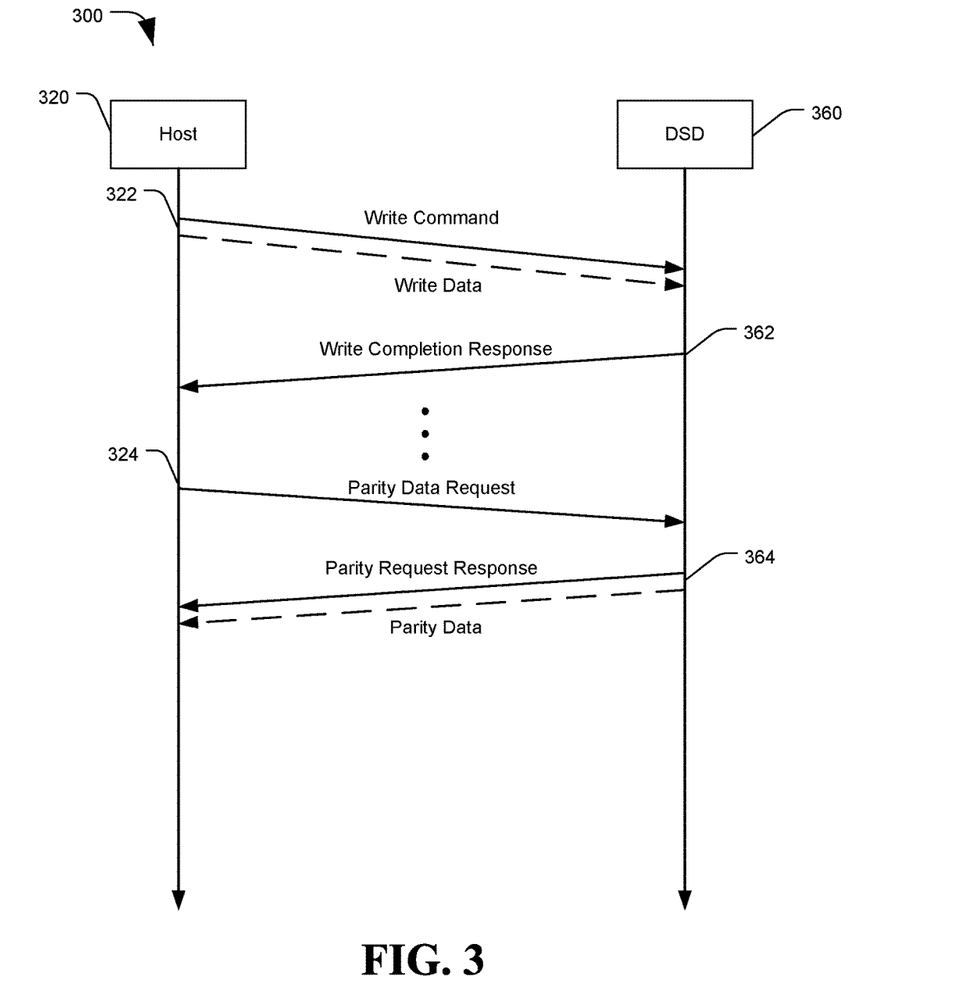
FIG. 3 is a process flow diagram of a system configured to employ host-assisted error recovery, in accordance with certain embodiments of the present disclosure.

FIG. 3 is a process flow diagram, generally designated 300, of a system configured to employ host-assisted error recovery, in accordance with certain embodiments of the present disclosure. In particular, process 300 includes an exchange of communications and data between a host 320 and a DSD 360, such as an SSD. The process 300 may include a write command issued by a host, and parity data generated by the SSD 360 returned to the host 320 for storage.

In the depicted embodiment, the host 320 and the SSD 360 may communicate via a SATA (Serial AT Attachment)

interface as an example, although a nonvolatile memory express (NVMe) interface or other interface may employ a similar mechanism.

The host 320 may send a write command and associated write data, at 322. The DSD 360 may receive the write command and the write data, and in response may store the write data to a memory of the DSD 360, such as a NVSSM. The DSD 360 may also generate or update parity data at this point, such as by XORing any pages newly written with the write data into parity data for the associated parity stripe. As an example of updating parity data, the DSD 360 may maintain parity XOR data for all open (e.g. not fully filled) parity stripes. Each time a new page of the parity stripe is written, the new data may be XORed into the parity data for that stripe, thereby updating the parity data for that stripe. If the DSD 360 does generate parity data at this point, it may be stored to a temporary region, such as buffer space of a volatile memory such as DRAM. If a read failure occurs while the parity data is in temporary storage, the parity data may still be available to perform error correction. However, the DSD 360 may optionally not generate parity data at this point.

The DSD 360 may return a write completion response to the host 320, at 362. The write completion response may indicate that the write data has been received successfully and stored to memory. In some embodiments, the write completion response may provide an indicator that new or updated parity data is available (e.g. already generated or available for generation), such as by setting a flag (e.g. a bit) in the response header, or via other means.

The host 320 may send a parity data request to the DSD 360, at 324. The parity data request may be initiated by host drivers configured to work with the DSD 360 to obtain and store DSD parity data at the host 320. The parity data request may be sent at various times based on the implementation. For example, the host 320 may send the request in response to receiving the write completion response at 362, either immediately or at a later point when the host 320 has processing capacity or bandwidth for handling the parity data request. In some implementations, the host 320 may send parity data requests at regular intervals (e.g. every five minutes), or in response to receiving a response from the DSD 360 with a "parity data available" flag set, or when the host 320 is idle, or any combination thereof.

In response to the parity data request, the DSD 360 may return a parity request response and any associated parity data, at 364. The DSD 360 may generate the parity data if it has not yet done so, or if it generated the parity data and then discarded it due to needing the memory space or not receiving a parity data request for a long period. In implementations where parity data is sent to the host after every write, the parity data included in the response may only include that parity data related to the write command from 322. In some embodiments, the DSD 360 may provide any "dirty" parity data. Dirty parity data may include any parity data that the DSD 360 has generated or updated but that has not yet been provided to the host 320. For example, each time a host write command is executed dirty parity data may be generated, but the host 320 may only request parity data from the DSD 360 after a selected number of writes. In another example, parity data may be generated or updated when the DSD 360 performs garbage collection operations to free up space, and this parity data may not be directly related to a particular received write command from the host 320. Dirty parity data may be stored to a buffer or DRAM of the DSD 360 until it is provided to the host 320, and may also be stored to nonvolatile memory of the DSD 360 in case of unexpected power loss or when there is insufficient space in the volatile memory.

In addition to providing the parity data itself at 364, the DSD 360 may also send indicators or identifiers for the provided parity data, which may be used by drivers at the host 320 to determine a storage location for the parity data at the host, and which may be used by the DSD 360 to request specific parity data when needed to perform error correction. After receiving and storing the parity data, the host 320 may optionally send the DSD 360 an indication that the parity data was either successfully received and stored or not successfully received, and the DSD 360 may send an acknowledgement or resend the parity data as appropriate. The host drivers may also optionally return host address information for the received parity data to the DSD 360, so that the DSD 360 may provide the address information when requesting the parity data later. The process of providing the parity data to the host is further described in regards to FIG. 4.

Figure 4:
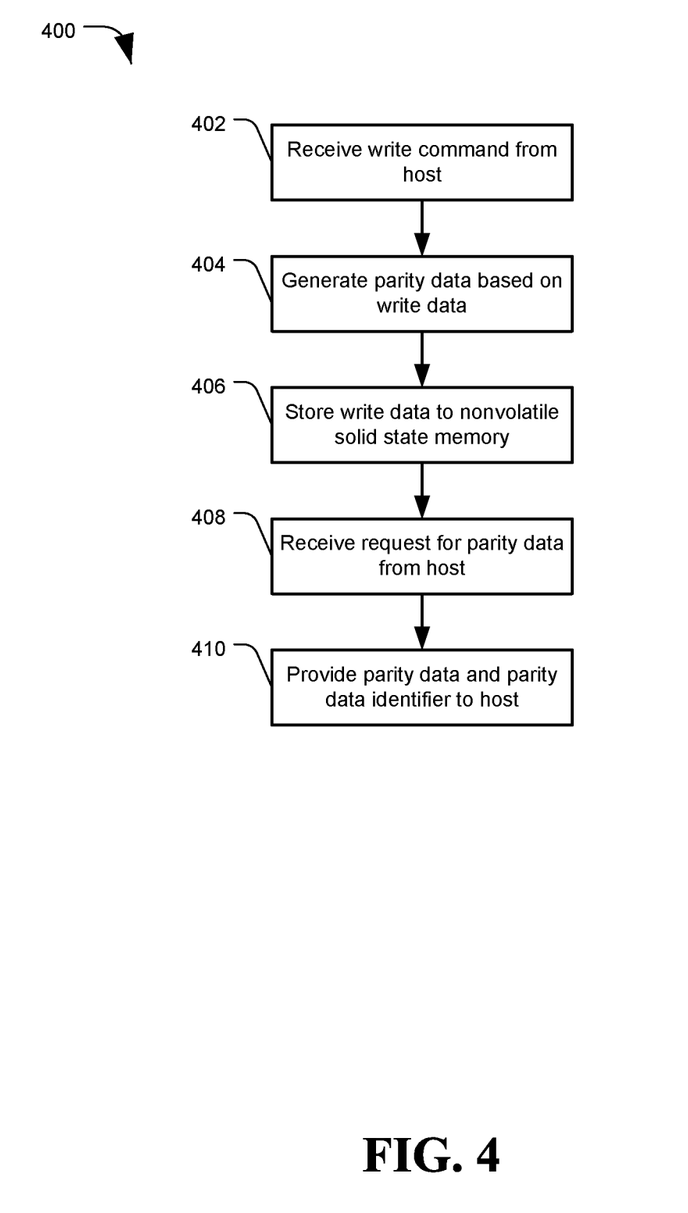
FIG. 4 is a flowchart of a method for host-assisted error recovery, in accordance with certain embodiments of the present disclosure.

FIG. 4 is a flowchart of a method, generally designated 400, for host-assisted error recovery, in accordance with certain embodiments of the present disclosure. The method 400 may be performed by an ECM as described herein, or by one or more other components of a data storage device.

Method 400 may include receiving a write command from a host, at 402. The DSD may generate parity data based on the host write data, at 404, and store the host write data to a nonvolatile solid state memory of the DSD, at 406. In some embodiments, the DSD may not generate parity data until it is requested by the host device.

At 408, the DSD may receive a request for parity data from the host. In response the DSD may provide the parity data and a parity data identifier to the host, at 410. The DSD may provide the parity data as fixed-sized chunks (e.g. corresponding to a page size of an SSD, or a sector size of the host), and a parity data identifier may be associated with each parity data chunk. Drivers at the host may be configured to store the parity data. The parity data may be stored to a location at the host selected by the drivers based on the identifier (e.g. by performing a hash operation or other algorithm on the identifier to derive a host storage address), or may select a host storage location by other means and use a mapping or lookup table to associate the host storage location to the received identifier.

Figure 5:
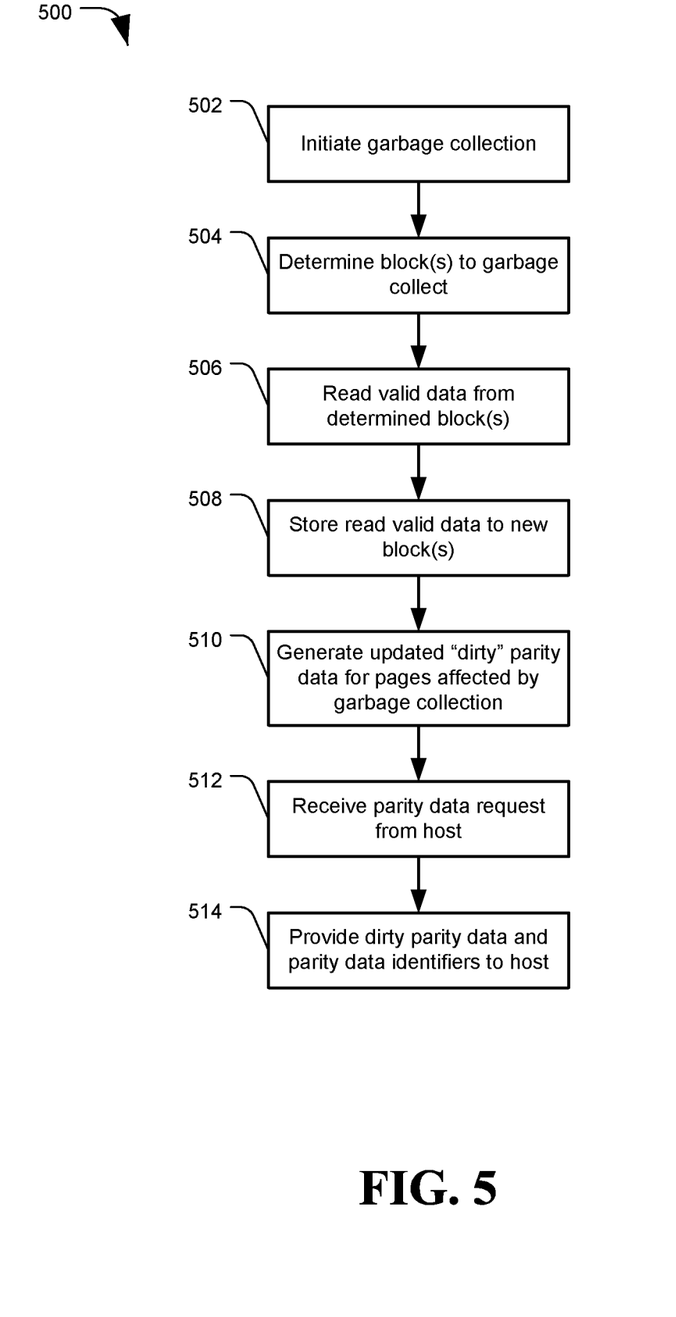
FIG. 5 is a flowchart of a method for host-assisted error recovery, in accordance with certain embodiments of the present disclosure.

Turning now to FIG. 5, a flowchart of a method 500 for host-assisted error recovery is shown, in accordance with certain embodiments of the present disclosure. In particular, method 500 may be directed to providing parity data to a host after performing garbage collection operations. The method 500 may be performed by an ECM, or by one or more other components of a data storage device As discussed herein, some types of solid state memory such as NAND flash can be written in small units (e.g. pages), but stored data cannot be edited and can only be erased in larger units (e.g. blocks). In order to recover storage capacity as the SSD fills with valid and invalid data, garbage collection operations may be used to copy the valid data to a new storage location (thereby invalidating the old version of the data) and then erase blocks containing only invalid data. This process may change the data stored to parity stripes, and may therefore invalidate or require updating or generating new parity data.

Method 500 may include initiating a garbage collection operation at the SSD, at 502. Garbage collection may be initiated when the SSD is in an idle period, when the available capacity falls below a selected threshold, or based on other criteria. The method 500 may include determining one or more blocks to garbage collect, at 504. Blocks may be selected based on an amount of invalid data in the block, based on wear leveling routines, or based on other considerations.

Once a block has been selected for garbage collection, the method 500 may include reading the valid data from the block, at 506, and storing the read data to a new block, at 508. The old block may be erased and made available for storing future data once all valid data has been copied to a new location. Because pages of the old block have been erased, and pages of the new block have been written with the copied valid data, a garbage collection operation may affect the contents of some or all parity stripes of the SSD. Accordingly, previously stored parity data for those parity stripes may no longer be valid and may not be useable in performing error correction.

The method 500 may therefore include generating updated "dirty" parity data for pages or parity stripes affected by the garbage collection, at 510. For example, the pages of each parity stripe affected by the garbage collection may be XORed together to generate new parity data, which is not yet stored at the host device.

At 512, the method 500 may include receiving a parity data request from the host. For example, the host may send parity data requests after performing write operations, after selected time intervals, when the host is idle, or at other times. The parity data requests may not request specific parity data, but may instead be an open request for the SSD to provide all dirty parity data. In response to the parity data request, the method 500 may include providing the dirty parity data and associated parity data identifiers to the host, at 514. Optionally, the SSD may also identify parity data that had been previously stored at the host that is no longer valid after garbage collection. A process of employing the parity data for error correction is discussed in regard to FIG. 6.

Figure 6:
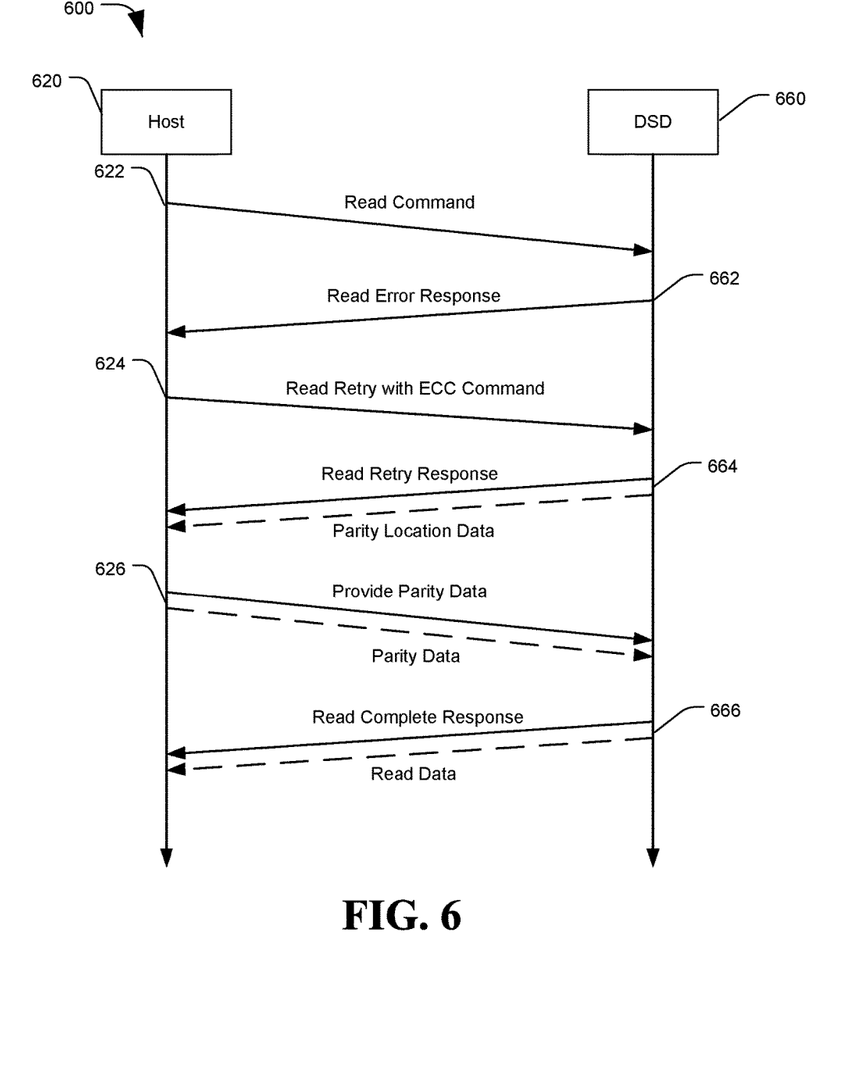
FIG. 6 is a process flow diagram of a system configured to employ host-assisted error recovery, in accordance with certain embodiments of the present disclosure.

FIG. 6 is a process flow diagram, generally designated 600, of a system configured to employ host-assisted error recovery, in accordance with certain embodiments of the present disclosure. In particular, process 600 includes an exchange of communications and data between a host 620 and a DSD 660, such as an SSD. The process 600 may include the DSD 660 requesting parity data from the host 620 in order to perform error correction.

The host 620 may transmit a read command 622 to the DSD 660. In response, the DSD 660 may attempt to read the requested data from the DSD. The DSD 660 may encounter an UECC error if attempts to read one or more pages of the requested data fails. After the read fails, the DSD 660 may return a read error response 662 to the host 620, indicating that the DSD was unable to complete the read command.

The read error response 662 may be received by host drivers managing parity data at the host 620 for the DSD 660. The host 620, e.g. via the drivers, may send a read retry with ECC command 624 to the DSD 660. This command may initiate the exchange of parity data from the host 620 to the DSD 660, when the host does not know what parity data is required to perform error correction for the read command. The DSD 660 may respond to the read retry 624 with a read retry response and the parity location data 664 for parity data needed to perform the error correction for the failed read units. Parity location data may include actual host address information (e.g. an LBA or PBA), or may include one or more parity data identifiers that the host drivers can use to locate the corresponding parity data. For example, the read command 622 may have requested data from multiple pages located in different parity stripes. Two pages may have failed to read, from two different parity stripes. Accordingly, the DSD 660 may send parity data identifiers to the host corresponding to the two parity stripes for which page read failures occurred.

The host drivers may use the parity location data to read the requested parity data from host data storage, and may provide the parity data 626 to the DSD 660. Based on the received parity data 626, the DSD 660 may perform error correction to attempt to recover the failed sectors (e.g. via an XOR algorithm including the parity data and successfully read pages from the parity stripe). The DSD 660 may then provide a read complete response along with the requested read data, at 666. A method of performing host-assisted error correction is further described in regard to FIG. 7.

Figure 7:
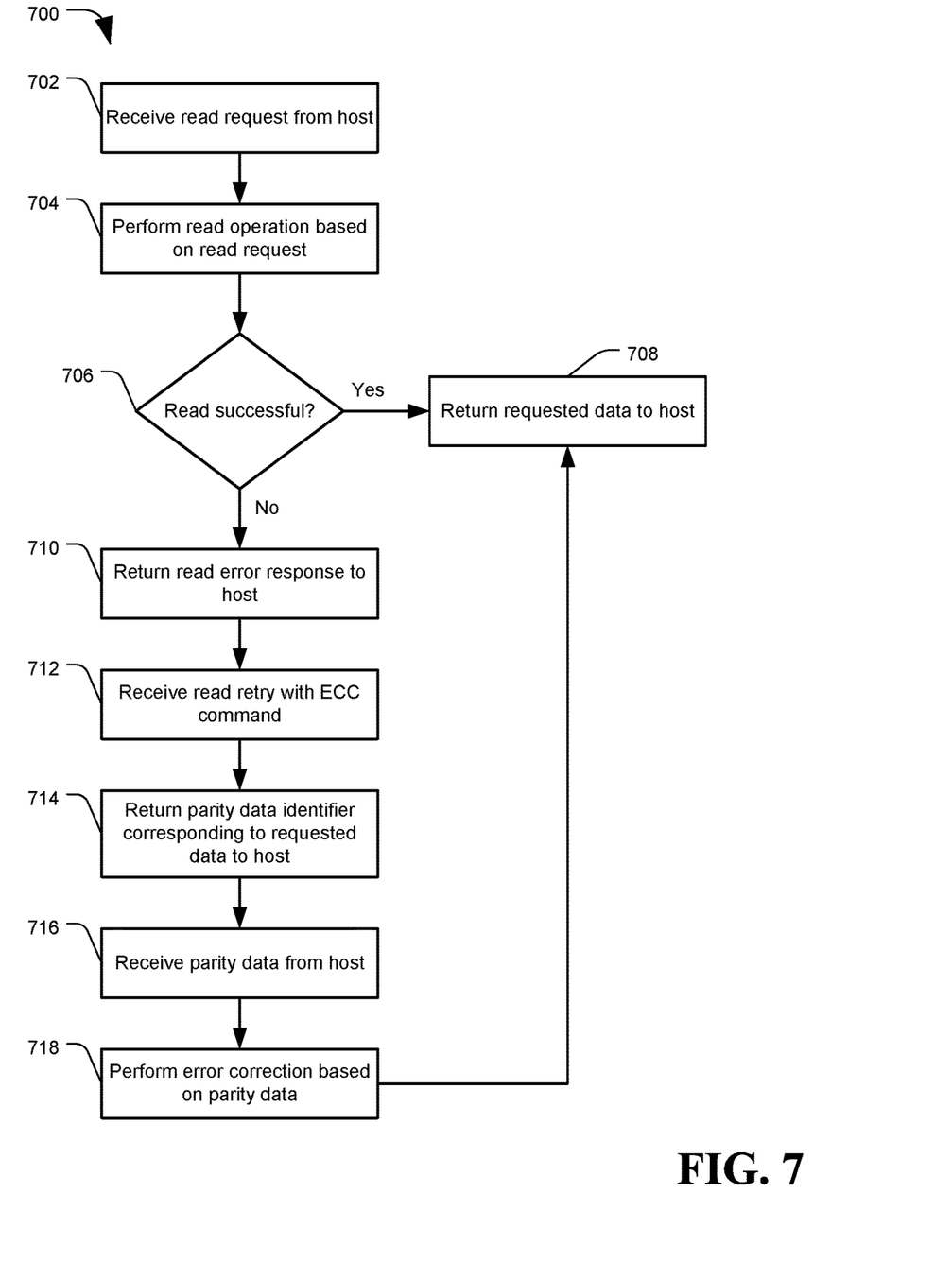
FIG. 7 is a flowchart of a method for host-assisted error recovery, in accordance with certain embodiments of the present disclosure.

FIG. 7 is a flowchart of a method 700 for host-assisted error recovery, in accordance with certain embodiments of the present disclosure. The method 700 may be performed by an ECM, or by one or more other components of a data storage device.

The method 700 may include receiving a read request from a host at a data storage device such as an SSD, at 702. In response, the method 700 may include performing a read operation based on the read request, at 704. A determination may then be made if the read was successful, at 706. The read may be successful if the data was read without requiring error correction, or if error correction operations available without parity data from the host were successful in recovering the data. If the read was successful, the method 700 may include returning the requested data to the host, at 708.

If the read was not successful, at 706, the method 700 may include returning a read error response to the host (e.g. a UECC error response), at 710. The method 700 may then include receiving a read retry with error correction code (ECC) command, at 712, instructing the SSD to request parity data from the host in order to perform error correction for the read request.

The method 700 may include returning one or more parity data identifier corresponding to the requested data to the host, at 714. In particular, the one or more parity data identifier may correspond to parity stripes including pages for which read errors were encountered. The requested parity data may be received from the host, at 716. The method 700 may then include performing error correction based on the received parity data, at 718, and returning the requested read data to the host, at 708.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
a data storage drive including:
an interface to communicate with a host device;
a nonvolatile solid state memory;
a processor configured to:
calculate parity data based on a plurality of pages from the nonvolatile solid state memory; and
provide, in response to a request for the parity data received from the host device via the interface, the parity data to the host device with an indication to store the parity data to a nonvolatile storage medium.

2. The apparatus of claim 1 further comprising:
the indication to store the parity data includes an identifier used to request the parity data from the host device for error correction.

3. The apparatus of claim 2 further comprising:
the processor further configured to:
receive a read request from the host device for stored data stored to a page from the plurality of pages;
perform a read operation for the stored data;
when a read error is encountered during the read operation:
return an error indicator to the host device;
provide the identifier to the host device for the parity data;
receive an error correction request from the host including the parity data; and
perform error correction based on the parity data to recover the stored data.

4. The apparatus of claim 1 further comprising:
the processor further configured to:
receive a write request from the host device including host data to store to the nonvolatile solid state memory;
store the host data to a selected page having a first offset within a first block of the nonvolatile solid state memory;
generate the parity data based on the selected page from the first block and other pages at the first offset within other blocks of the nonvolatile solid state memory;
receive a parity data request from the host device; and
provide the parity data to the host device in response to the parity data request.

5. The apparatus of claim 1 further comprising:
the processor further configured to:
perform garbage collection on blocks of the nonvolatile solid state memory;
generate new sets of parity data based on pages from the blocks that were garbage collected; and
provide the new sets of parity data to the host device in response to a request from the host for the parity data.

6. The apparatus of claim 1 further comprising:
the nonvolatile solid state memory includes Flash memory; and
the processor further configured to generate the parity data based on a corresponding page from a corresponding block from each memory die of the Flash memory.

7. A system comprising:
a data storage drive including:
an interface to communicate with a host device;
a nonvolatile solid state memory;
a controller configured to:
calculate parity data based on a plurality of pages from the nonvolatile solid state memory;
receive a request for the parity data from the host device;
provide, via the interface in response to the request, the parity data to the host device with an indication to store the parity data to a nonvolatile storage medium;
the host device, including a processor configured to:
send the request to the data storage drive; and
store the parity data to a persistent memory internal to the host device.

8. The system of claim 7 further comprising:
the indication to store the parity data includes an identifier used to request the parity data from the host for error correction; and
the processor configured to store the parity data to a location of the persistent memory selected based on the identifier.

9. The system of claim 8 further comprising:
the controller further configured to:
receive a read request from the host device for stored data stored to a page from the plurality of pages;
perform a read operation for the stored data;
when a read error is encountered during the read operation:
return an error indicator to the host device;
provide the identifier to the host device for the parity data;
receive an error correction request from the host including the parity data;
perform error correction based on the parity data to recover the stored data;
the processor configured to:
issue the read request;
retrieve the parity data from the persistent memory based on the identifier using drivers installed at the host to facilitate storage and retrieval of the parity data; and
issue the error correction request.

10. The system of claim 7 further comprising:
the controller further configured to:
receive a write request from the host device including host data to store to the nonvolatile solid state memory;
store the host data to a selected page of the nonvolatile solid state memory;
generate the parity data based on the selected page from a first block and corresponding pages from other blocks of the nonvolatile solid state memory;
receive a parity data request from the host device; and
provide the parity data to the host device in response to the parity data request; and
the processor configured to issue the parity data request at selected time intervals.

11. The system of claim 7 further comprising:
the controller further configured to:
perform garbage collection on blocks of the nonvolatile solid state memory;
generate new sets of parity data based on pages from the blocks that were garbage collected; and
provide the new sets of parity data to the host device in response to a request from the host for the parity data.

12. The system of claim 7 further comprising:
the nonvolatile solid state memory includes Flash memory;
the controller further configured to generate the parity data based on a corresponding page from a corresponding block from each memory die of the Flash memory; and
the persistent memory includes a hard disc drive.

13. A method comprising:
calculating parity data based on a plurality of pages from a nonvolatile solid state memory at a data storage drive; and
receive a parity data request from a host device;
responding to the parity data request by providing the parity data from the data storage drive to the host device with an indication to store the parity data to a nonvolatile storage medium of the host device.

14. The method of claim 13 further comprising:
providing, along with the parity data and the indication, an identifier for the parity data used to request the parity data from the host device for error correction.

15. The method of claim 14 further comprising:
receiving a read request from the host device for stored data stored to a page from the plurality of pages;
performing a read operation for the stored data;
when a read error is encountered during the read operation:
  returning an error indicator to the host device;
  providing the identifier to the host device for the parity data;
  receiving an error correction request from the host device including the parity data; and
  performing error correction based on the parity data to recover the stored data.

16. The method of claim 13 further comprising:
receiving a write request from the host device including host data to store to the nonvolatile solid state memory;
storing the host data to a selected page having a first offset within a first block of the nonvolatile solid state memory; and
generating the parity data based on the selected page from the first block and other pages at the first offset of other blocks of the nonvolatile solid state memory in response to the parity data request.

17. The method of claim 13 further comprising:
performing garbage collection on blocks of the nonvolatile solid state memory;
generating new sets of parity data based on pages from the blocks that were garbage collected; and
providing the new sets of parity data to the host device in response to a request from the host for the parity data.

18. The method of claim 16 wherein:
the parity data comprises an outer code (OC) parity page; and
the plurality of pages comprise a parity stripe, the parity stripe including a set of pages at a selected page offset of a plurality of blocks of the solid state memory.

19. The system of claim 10 wherein:
the parity data comprises an outer code (OC) parity page; and
the plurality of pages comprise a parity stripe, the parity stripe including a set of pages at a selected page offset of a plurality of blocks of the solid state memory.

20. The apparatus of claim 1 further comprising:
the processor further configured to calculate the parity data as an outer code (OC) parity page based on the plurality of pages from the nonvolatile solid state memory that comprise a parity stripe.

* * * * *